United States Patent
Lee et al.

(10) Patent No.: US 10,281,755 B2
(45) Date of Patent: May 7, 2019

(54) DISPLAY APPARATUS

(71) Applicant: SAMSUNG DISPLAY CO., LTD., Yongin, Gyeonggi-Do (KR)

(72) Inventors: Sang-Chul Lee, Yongin-si (KR); Min-Sung Choi, Cheonan-si (KR); Sang-Hyeok Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 13 days.

(21) Appl. No.: 15/498,544

(22) Filed: Apr. 27, 2017

(65) Prior Publication Data

US 2017/0227810 A1 Aug. 10, 2017

Related U.S. Application Data

(63) Continuation of application No. 14/471,131, filed on Aug. 28, 2014, now Pat. No. 9,668,363, which is a continuation of application No. 13/591,394, filed on Aug. 22, 2012, now Pat. No. 8,821,000.

(30) Foreign Application Priority Data

Aug. 23, 2011 (KR) .................. 10-2011-0083750

(51) Int. Cl.
*F21V 8/00* (2006.01)
*G02F 1/1333* (2006.01)
*H05K 5/00* (2006.01)
*H05K 5/03* (2006.01)

(52) U.S. Cl.
CPC ....... *G02F 1/133308* (2013.01); *G02B 6/009* (2013.01); *G02B 6/0011* (2013.01); *G02B 6/0088* (2013.01); *H05K 5/0017* (2013.01); *H05K 5/03* (2013.01); *G02F 2001/13332* (2013.01); *G02F 2001/133314* (2013.01); *G02F 2001/133317* (2013.01); *G02F 2001/133322* (2013.01); *G02F 2001/133331* (2013.01); *G02F 2201/46* (2013.01); *G02F 2202/28* (2013.01)

(58) Field of Classification Search
CPC ... G02F 1/133308; G02F 2001/133322; G02F 2001/133317; G02F 2001/133314; G02F 1/133615; G02B 6/009; G02B 6/0088
See application file for complete search history.

(56) References Cited

U.S. PATENT DOCUMENTS

| 6,977,694 B2 | 12/2005 | Natsuyama |
| 2006/0044286 A1 | 3/2006 | Kohlhaas et al. |
| 2006/0092348 A1 | 5/2006 | Park |

(Continued)

FOREIGN PATENT DOCUMENTS

| EP | 2487526 A1 | 8/2012 |
| JP | 2002072910 A | 3/2002 |

(Continued)

*Primary Examiner* — Evan P Dzierzynski
(74) *Attorney, Agent, or Firm* — Cantor Colburn LLP

(57) ABSTRACT

A display apparatus includes a display panel, a first covering part, an upper frame and a lower frame. The first covering part is disposed on the display panel. The upper frame is disposed under the first covering part and includes a first combining portion. The lower frame is combined with the upper frame through the first combining portion, and overlaps a peripheral portion of the display panel.

15 Claims, 9 Drawing Sheets

(56) References Cited

U.S. PATENT DOCUMENTS

| | | | |
|---|---|---|---|
| 2007/0188675 A1* | 8/2007 | Tsubokura | G02F 1/133308 349/58 |
| 2009/0126244 A1 | 5/2009 | Hu et al. | |
| 2009/0256796 A1 | 10/2009 | Jang et al. | |
| 2010/0203924 A1 | 8/2010 | Hirota | |
| 2010/0321953 A1 | 12/2010 | Coleman et al. | |
| 2012/0162569 A1* | 6/2012 | Sekiguchi | G02F 1/133308 349/58 |

FOREIGN PATENT DOCUMENTS

| | | |
|---|---|---|
| JP | 2008212435 A | 9/2008 |
| JP | 2009237493 A | 10/2009 |
| KR | 1020060084558 A | 7/2006 |
| WO | 2008065788 A1 | 6/2008 |

* cited by examiner

DISPLAY APPARATUS

This application is a continuation of U.S. application Ser. No. 14/471,131 filed Aug. 28, 2014, which is a continuation of U.S. application Ser. No. 13/591,394 filed Aug. 22, 2012 and issued as U.S. Pat. No. 8,821,000 on Sep. 2, 2014, which claims priority to Korean Patent Application No. 10-2011-0083750, filed on Aug. 23, 2011, and all the benefits accruing there from under 35 U.S.C. § 119, the contents of which are herein incorporated by reference in their entireties.

BACKGROUND OF THE INVENTION

1. Field of the Invention

Exemplary embodiments of the invention relate to a display apparatus. More particularly, exemplary embodiments of the invention relate to a display apparatus displaying an image.

2. Description of the Related Art

Generally, a display apparatus includes a display panel displaying an image and a backlight assembly supplying a light to the display panel. A display apparatus using the light from outside of the display apparatus instead of the backlight assembly has been developed.

However, if the backlight assembly is omitted, a bottom receiving plate supporting the whole display apparatus is also omitted so that a stability of the display apparatus is decreased. For example, a large-sized display apparatus without the backlight assembly has only a frame structure supporting the display apparatus, so that the stability of the display apparatus is not guaranteed.

In addition, when the backlight assembly includes a light guiding plate having a relatively high transparency, the transparency and the structural stability of the display apparatus may be hard to be maintained at the same time.

BRIEF SUMMARY OF THE INVENTION

Exemplary embodiments of the invention provide a display apparatus capable of improving transparency and structural stability.

According to an exemplary embodiment of the invention, a display apparatus includes a display panel, a first covering part, an upper frame including a first combining portion, and a lower frame. The first covering part is disposed on the display panel. The upper frame is disposed under the first covering part. The lower frame is combined with the upper frame through the first combining portion and overlaps a peripheral portion of the display panel.

In an exemplary embodiment, the upper frame may be spaced apart from the display panel in a plan view.

In an exemplary embodiment, the first covering part may include a tempered glass.

In an exemplary embodiment, the first combining portion may protrude toward the lower frame.

In an exemplary embodiment, the upper frame may be attached to the first covering part by an adhesive.

In an exemplary embodiment, the upper frame may face the peripheral portion of the display panel. An elastic part may be at a side of the upper frame adjacent to the display panel, to protect a side of the display panel.

In an exemplary embodiment, the lower frame may include a first lower frame portion under the upper frame and a second lower frame portion extending from the first lower frame portion and under the display panel.

In an exemplary embodiment, the lower frame may be combined with a first combining portion of the upper frame by a combining part.

In an exemplary embodiment, the first combining portion may include a first combining hole. The first lower frame portion may include a second combining hole aligned with the first combining hole. The combining part may be combined with the first combining hole through the second combining hole to fix the upper frame and the first lower frame portion.

In an exemplary embodiment, the upper frame and the first lower frame portion may be fixed to each other.

In an exemplary embodiment, the display apparatus may further include a driving part connected to a first side of the display panel to drive the display panel. A first area of the first lower frame portion corresponding to the first side of the display panel may be larger than a remaining area of the first lower frame portion.

In an exemplary embodiment, the driving part may be disposed at the first area of the first lower frame portion.

In an exemplary embodiment, the display apparatus may further include a connector connecting the driving part to outside and disposed at an end portion of the driving part.

In an exemplary embodiment, the second lower frame portion supports the peripheral portion of the display panel.

In an exemplary embodiment, the second lower frame portion may further include an elastic part to support the display panel.

In an exemplary embodiment, an area of the first covering part overlapping the upper frame may have a black color.

In an exemplary embodiment, the display apparatus may further include a second covering part disposed under the second lower frame portion.

In an exemplary embodiment, the lower frame may further include a stepped portion connecting the first lower frame portion to the second lower frame portion. Sides of the second covering part may make contact with the stepped portion.

In an exemplary embodiment, the display apparatus may further include a supporting frame supporting the second covering part and combined with the first lower frame portion.

In an exemplary embodiment, the display apparatus may further include a backlight assembly. The backlight assembly may include a light guiding plate, a light source and a supporting frame. The light guiding plate may be disposed under the second lower frame portion. The light source may be disposed at a side of the light guiding plate. The supporting frame may overlaps a peripheral portion of the light guiding plate and the light source, and be combined with the lower frame.

In an exemplary embodiment, the supporting frame may include a first supporting frame portion, a second supporting frame portion and a third supporting frame portion. The first supporting frame portion may be under the first lower frame portion and combined with the first lower frame portion. The second supporting frame portion may be under the light guiding plate. The third supporting frame portion may connect the first supporting frame portion to the second supporting frame portion, and receive the light source.

In an exemplary embodiment, the lower frame includes a stepped portion connecting the first lower frame portion to the second lower frame portion. The light source may be disposed on the stepped portion.

According to another exemplary embodiment of the invention, a display apparatus includes a first covering part, a display panel, an upper frame and a lower frame. The display panel is disposed under the first covering part. The upper frame is disposed around the display panel. The lower frame includes a first lower frame portion and a second lower frame portion. The first lower frame portion is combined with the upper frame. The second lower frame portion extends from the first lower frame portion and is disposed under the display panel.

In an exemplary embodiment, wherein the first covering part may include a transparent material.

In an exemplary embodiment, the second lower frame portion may overlap a peripheral portion of the display panel.

In an exemplary embodiment, the lower frame further may further include a stepped portion having a first height. The stepped portion may connect the second lower frame portion to the first lower frame portion.

In an exemplary embodiment, the upper frame is spaced apart from the display panel when viewed from a top of the first covering part.

In an exemplary embodiment, the upper frame is overlapped with the lower frame when viewed from the top of the first covering part, and an area of the upper frame is smaller than that of the lower frame.

In an exemplary embodiment, the upper frame may include a first combining portion.

In an exemplary embodiment, the lower frame may be combined with the upper frame through the first combining portion. The lower frame may overlap a peripheral portion of the display panel.

In an exemplary embodiment, the first combining portion of the upper frame may protrude toward the lower frame.

In an exemplary embodiment, the display apparatus may further include a combining part which combines the lower frame with the first combining portion of the upper frame.

In an exemplary embodiment, the first combining portion of the upper frame may include a first combining hole. The first lower frame portion may include a second combining hole which is aligned with the first combining hole. The combining part may be combined with the first combining hole and extend through the second combining hole.

In an exemplary embodiment, the display apparatus may further include a second covering part overlapping the second lower frame portion.

In an exemplary embodiment, the lower frame further may include a stepped portion which connects the first lower frame portion to the second lower frame portion. Sides of the second covering part may contact the stepped portion.

In an exemplary embodiment, the display apparatus may further include a supporting frame. The second covering part may be between the supporting frame and the second lower frame portion. The supporting frame may be combined with the first lower frame portion.

According to the invention, the display apparatus includes a first covering part, an upper frame and a lower frame, so that a display panel may be stably fixed without an additional backlight assembly having a receiving container. The first covering part is disposed on the display panel, the upper frame is attached under the first covering part, and the lower frame includes a first lower frame portion combined with the upper frame and a second lower frame portion supporting the display panel, so that the display apparatus may improve transparency and structural stability.

In addition, the display apparatus may be easily assembled and disassembled, so that manufacturing process and repairing process may be simplified.

In addition, the driving part is disposed at the first side of the display panel in a line, so that the display apparatus may have a transparent structure of the display panel and have a relatively thin frame width at the same time.

BRIEF DESCRIPTION OF THE DRAWINGS

The above and other features of the invention will become more apparent by describing in detail exemplary embodiments thereof with reference to the accompanying drawings, in which.

DETAILED DESCRIPTION OF THE INVENTION

Figure 1:
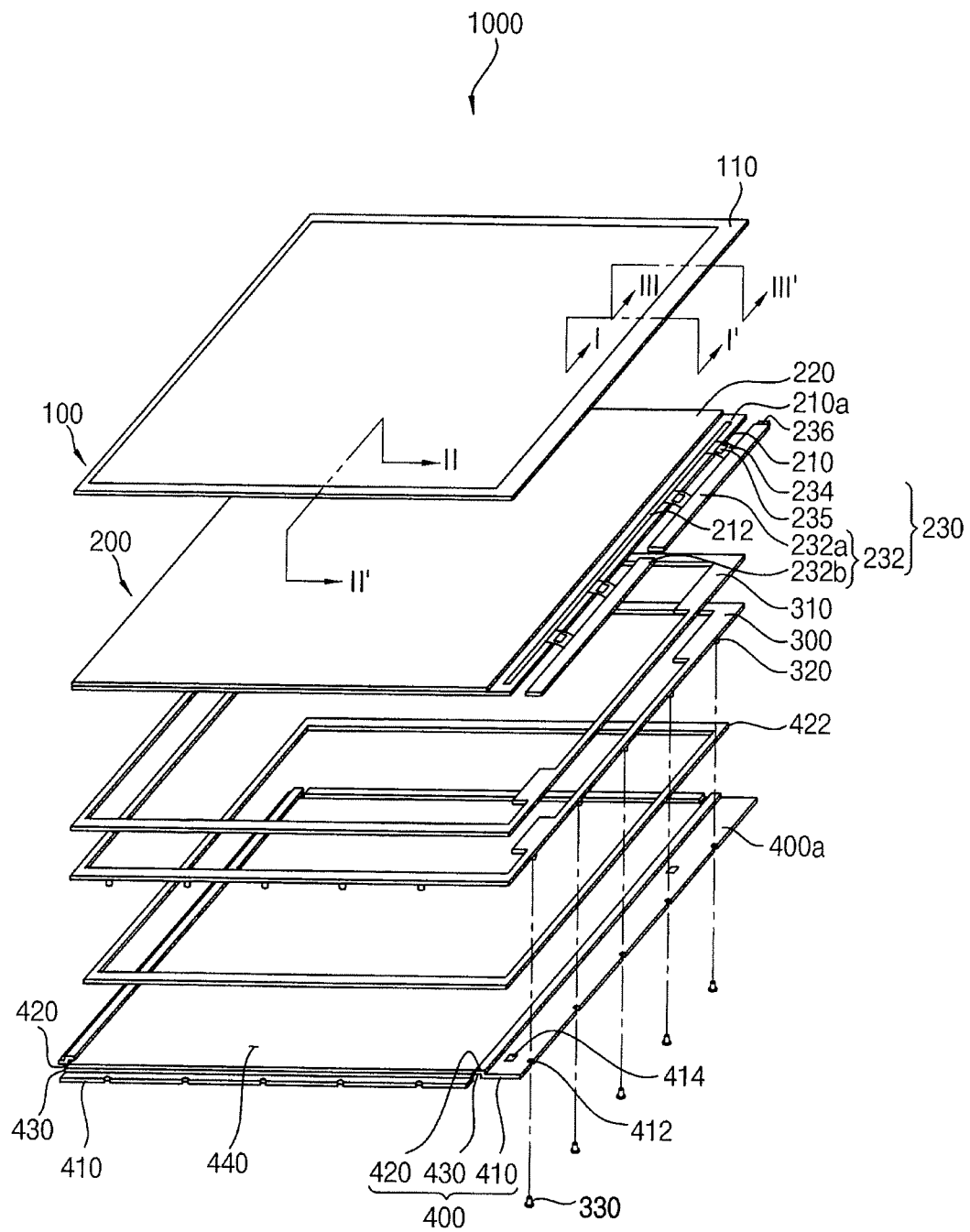
FIG. 1 is an exploded perspective view illustrating an exemplary embodiment of a display apparatus according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" or "above" relative to the other elements or features. Thus, the exemplary term "under" can encompass both an orientation of above and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

Figure 2:
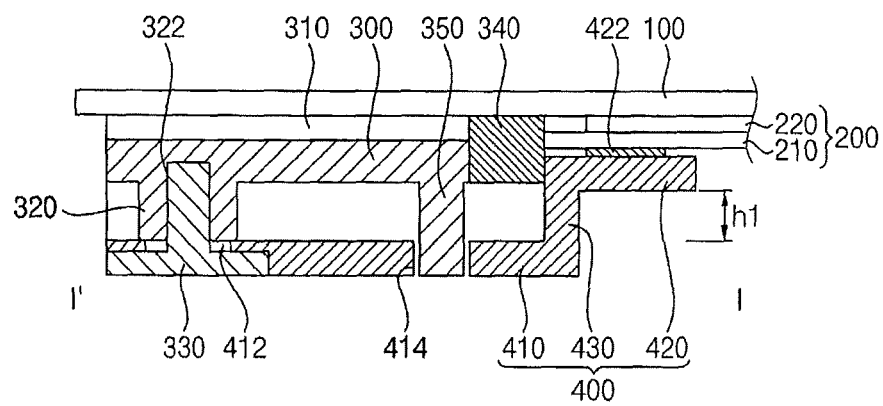
FIG. 2 is a cross-sectional view taken along line I-I' of FIG. 1.
Figure 3:
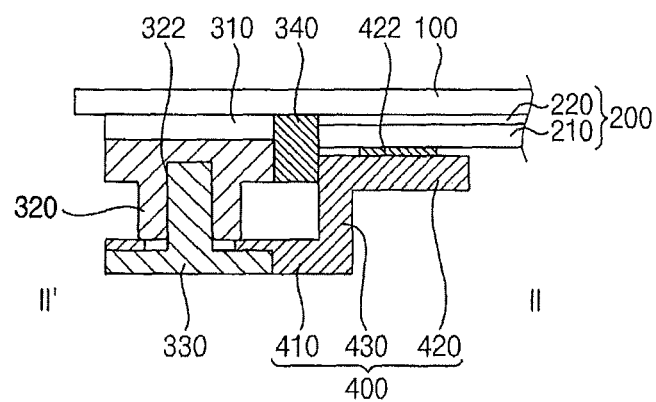
FIG. 3 is a cross-sectional view taken along line II-II' of FIG. 1.

FIG. 1 is an exploded perspective view illustrating an exemplary embodiment of a display apparatus according to the invention. FIG. 2 is a cross-sectional view taken along line I-I' of FIG. 1. FIG. 3 is a cross-sectional view taken along line II-IF of FIG. 1.

Referring to FIGS. 1 to 3, the display apparatus 1000 includes a first covering part 100, a display panel 200, an upper frame 300 and a lower frame 400.

The display panel 200 displays an image in response to external driving and data signals using a light from outside. The display panel 200 may include an array substrate 210, an opposite substrate 220 facing with the array substrate 210, and a liquid crystal layer (not shown) disposed between the array substrate 210 and the opposite substrate 220. A driving pad 212 may be formed at a first side 210a of the array substrate 210, electrically connected to signal lines, and electrically connected to a driving part 230 to drive the display panel 200.

The driving part 230 may include a driving board 232 providing a driving signal to the display panel 200, and a flexible printed circuit board ("FPCB") 234 connecting the driving board 232 to the display panel 200. A driving chip 235 is mounted on the FPCB 234. The driving part 230 may include a first driving board 232a and a second driving board 232b. The driving part 230 may disposed adjacent to the first side 210a of the display panel 200. The first and second driving boards 232a and 232b may be spaced apart in a first direction D1 which is a longitudinal direction of the first side 210a. In an exemplary embodiment, for example, each of the first and second driving boards 232a and 232b may include a pair of first sides extending along the first direction D1, and a pair of second sides which are shorter than the first sides, extending along a second direction D2 crossing the first direction D1.

A connector 236 connecting the first driving board 232a to an external power supply (not shown) may be at one of the second sides of the first driving board 232a. The connector 236 may be at one of the second sides of the first driving board 232a which is farthest from the second driving board 232b. Alternatively, the connector 236 may be at one of the first sides of the first driving board 232a which is farthest from the display panel 200. The connector 236 is at the second side of the first driving board 232a which is furthest from the second driving board 232b so that the external power supply may be more easily connected to the connector 236, compared to the connector 236 at the second side of the first driving board 232a adjacent to the second driving board 232b.

The first covering part 100 is disposed on the display panel 200. The first covering part 100 may be a single, unitary, indivisible member. The first covering part 100 faces the opposite substrate 220 of the display panel 200. A total size (e.g. planar area) of the first covering part 100 is larger than that of the display panel 200 in the plan view. Thus, the first covering part 100 entirely covers and overlaps the display panel 200. The first covering part 100 includes a shading portion 110 at outer sides a peripheral portion of the first covering part 100 and partially covers the display apparatus 1000. The shading portion 110 may be formed by shading the peripheral portion of the first covering part 100 to a black color. The shading portion 110 is at a portion corresponding to (e.g., overlapping or aligned in position with) the upper frame 300 and the lower frame 400. The first covering part 100 may include a transparent material having relatively high hardness. In one exemplary embodiment, for example, the first covering part 100 may include tempered glass. In addition, the first covering part 100 may include a flexible transparent material, such as a transparent plastic.

The upper frame 300 is disposed under the first covering part 100. In the exemplary embodiment, for example, the upper frame 300 may have a rectangular frame shape corresponding to the peripheral portion of the first covering part 100. The upper frame 300 may be a frame shape having a central opening and having a rigid body. Alternatively, the upper frame 300 may include a plurality of frames which are combined each other to form a rectangular frame shape. The upper frame 300 is disposed under the peripheral portion of the first covering part 100. The upper frame 300 may be attached to the first covering part 100 by an adhesive 310. In one exemplary embodiment, for example, the adhesive 310 may be a double-sided adhesive tape.

The upper frame 300 includes at least one first combining portion 320 through which the upper frame 300 is combined with the lower frame 400. The first combining portion 320 protrudes from a lower surface of the upper frame 300 toward an upper surface of the lower frame 400. The first combining portion 320 includes a first combining hole 322. The first combining hole 322 may be combined with a combining part 330. In one exemplary embodiment, for example, the first combining hole 322 may have a thread of a screw to be combined with a bolt as the combining part 330.

When the upper frame 300 includes a plurality of the first combining portion 320, the first combining portions 320 may be around the upper frame 300 along peripheral portion of the upper frame 300 in a line, or in a zigzag shape.

The upper frame 300 is disposed around the display panel 200. The upper frame 300 and the display panel 200 are disposed not to overlap with each other when viewed from a top of the first covering part 100, to decrease thickness of the display apparatus 1000. A first elastic part 340 may be at a side of the upper frame 300 to protect a side of the display apparatus 1000. The upper frame 300 may be an area corresponding to the first side 220a larger than a remaining area. Thus, the upper frame 300 may be stably combined with the area corresponding to the first side 220a of the lower frame 400. The first elastic part 340 may include a rubber.

The upper frame 300 may further include a protruding portion 350 protruding toward a direction opposite to the first covering part 100. The protruding portion 350 is inserted into a third combining hole 414 of the lower frame 400. The protruding portion 350 and the third combining hole 414 provide a reference position to accurately combine the upper frame 300 with the lower frame 400. Thus, the upper frame 300 and the lower frame 400 may be stably combined with each other.

The lower frame 400 is disposed under the upper frame 300. The lower frame 400 and the upper frame 300 are combined with each other through the first combining portion 320. The lower frame 400 is combined with the upper frame 300 to support the display panel 200. The lower frame 400 may have a closed loop shape disposed around the display panel 200. Accordingly, the lower frame 400 exposes a display area of the display panel 200 except for a peripheral portion of the display panel 200. In the exemplary embodiment, for example, the lower frame 400 includes an opening 440 exposing the display area. Accordingly, the lower frame 400 may support the peripheral portion of the display panel 200. The lower frame 400 may be combined with the first combining portion 320 of the upper frame 300 by the combining part 330. In the exemplary embodiment, for example, the combining part 330 may include a bolt which is inserted into and fixed with the first combining hole 322.

The lower frame 400 includes a first lower frame portion 410 under the upper frame 300, and a second lower frame portion 420 under the display panel 200 and extending from the first lower frame portion 410. The first and second lower frame portions 410 and 420 are in different planes from each other. In the exemplary embodiment, for example, the second lower frame portion 420 extends from a side of the first lower frame portion 410 toward the display panel 200. The first and second lower frame portions 410 and 420 are spaced apart from each other by a first height h1 to form a stepped portion. Thus, the lower frame 400 includes a stepped portion 430. The first height h1 may be substantially same as height of the first combining portion 320 or smaller than the height of the first combining portion 320.

The first lower frame portion 410 includes a second combining hole 412 corresponding to the first combining portion 320 of the upper frame 300. The first combining portion 320 is disposed to correspond to the second combining hole 412 of the first lower frame portion 410. The combining part 330 may be inserted into the first combining hole 322 through the second combining hole 412 of the first lower frame portion 410. The combining part 330 may be disposed to correspond to (e.g., aligned with) the second combining hole 412, so that a protruded portion of the combining part 330 may be inserted into the second combining hole 412 and a remaining portion of the combining part 330, which is not inserted, may be partially overlapped with the first lower frame portion 410.

A portion of the first lower frame portion 410 adjacent to the second combining hole 412 may be disposed between the remaining portion of the combining part 330 and the first combining portion 320. In the exemplary embodiment, for example, an end portion of the first lower frame portion 410, which defines the second combining hole 412, may make contact with the first combining portion 320, so that the end portion of the first lower frame portion 410 may be pressed by the first combining portion 320 toward an extending direction of the first combining portion 320. That is, for example, the end portion of the first lower frame portion 410 may make contact with the first combining portion 320. Alternatively, a side of the first lower frame portion 410, which forms the end portion of the first lower frame portion 410 and faces the first combining portion 320, may make contact with the first combining portion 320.

Accordingly, the combining part 330 is inserted into the first combining hole 322. The portion of the first lower frame portion 410 is overlapped with and fixed with the first combining portion 320. The lower frame 400 may be strongly combined with the upper frame 300 by the combining part 330.

The first lower frame portion 410 may further include at least one third combining hole 414. The protruding portion 350 of the upper frame 300 is inserted into the third combining hole 414. The protruding portion 350 and the third combining hole 414 guide the combination of the upper frame 300 and the lower frame 400, so that the upper frame 300 and the lower frame 400 may be stably combined with each other.

The protruding portion 350 of the upper frame 300 may have a bar shape having a predetermined length in the plan view. The protruding portion 350 of the upper frame 300 may have a hook shape to be combined with the third combining hole 414, so that the upper frame 300 and the lower frame 400 may be stably fixed. When the upper frame 300 includes a plurality of the protruding portions 350, some of the protruding portions 350 may have the bar shape and some of the protruding portions 350 may have the hook shape.

The second lower frame portion 420 is under the display panel 200 and substantially parallel with the display panel 200. The second lower frame portion 420 supports the peripheral portion of the display panel 200. The first lower frame portion 410 is fixed at the upper frame 300 by the combining part 330, and the second lower frame portion 420 pushes the display panel 200 upwardly to fix the display panel 200. As mentioned above, the height of the stepped portion 430 may be substantially the same as or be slightly smaller than a height of the first combining portion 320. In the exemplary embodiment, for example, when the first lower frame portion 410 is combined with the upper frame 300 by the combining part 330, the stepped portion 430 may have the height such that the first lower frame portion 410 may stably fix and support the display panel 200. The second lower frame portion 420 may stably support the peripheral portion of the display panel 200, so that the display panel 200 may be stably fixed in the display apparatus 1000 with exposing a lower portion of the display panel 200 to outside.

The second lower frame portion 420 may further include a second elastic part 422. The second elastic part 422 is disposed between the display panel 200 and the second lower frame portion 420, and along the second lower frame portion 420. The second elastic part 422 reduces or effectively prevents damage to the second lower frame portion 420 when directly contacting the display panel 200, and compensates a difference of the height between the stepped portion 430 and the first combining portion 320. The second elastic part 422 may include the rubber.

The lower frame 400 includes the second lower frame portion 420 supporting the peripheral portion of the display panel 200, so that the upper frame 300 may not be exposed to outside of the display apparatus 1000 by the first lower frame portion 410 of the lower frame 400, the stepped portion 430 and the second lower frame portion 420. Accordingly, this structure may increase quality of appearance of the display apparatus 1000 and effectively block a foreign substance from reaching an inner area of the display apparatus 1000. In the exemplary embodiment, for example, complex units of the display apparatus 1000 which are exposed to outside of the display apparatus 1000 may be minimized by the lower frame 400, so that the quality of appearance may be increased. In addition, a flow of the foreign substance into the display apparatus 1000 through a gap between the display panel 200 and the upper frame 300 or a gap between the first covering part 100 and the display panel 200, may be reduced or effectively prevented. Thus, poor quality due to an inflow of the foreign substance may be reduced. The upper frame 300 is overlapped with the lower frame 400. A planar area of the upper frame 300 is smaller than a planar area of the lower frame 400 overlapping the upper frame 300.

Figure 4:
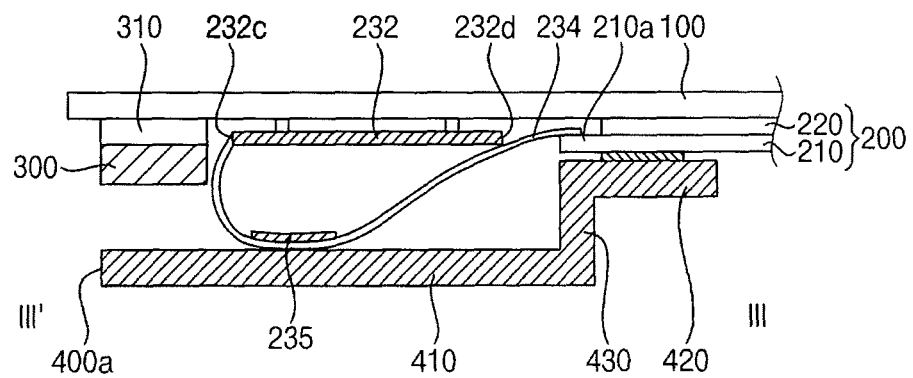
FIG. 4 is a cross-sectional view taken along line of FIG. 1.

FIG. 4 is a cross-sectional view taken along line of FIG. 1.

Referring to FIGS. 1 to 4, in the first lower frame portion 410, a first area 400a corresponding to the first side 210a of the display panel 200 has a planar area larger than a remaining area of the first lower frame portion 410. The driving part 230 is disposed on the first area 400a. The first area 400a is larger than the remaining area of the first lower frame portion 410, so that a portion of the display panel 200 including the driving part 230, may be stably supported. The driving board 232 is disposed facing the first covering part 100. The driving board 232 faces a lower surface of the first covering part 100 and is not overlapped with the upper frame 300. The FPCB 234 is bent from the first lower frame portion 410 toward the first covering part 100, so that the driving board 232 faces the first covering part 100. When the FPCB 234 is divided into a mounting surface on which the driving chip 235 is mounted and an opposite surface which faces the mounting surface, the driving board 232 faces the mounting surface. In addition, the driving board 232 may be fixed under the first covering part 100 by an adhesive.

The FPCB 234, which connects the driving board 232 to the display panel 200, extends from the display panel 200 and is connected to a first side 232c of the driving board 232. Thus, the FPCB 234 extends to the first side 232c of the driving board 232 opposite to a second side 232d of the driving board 232 which is adjacent to the display panel 200, and is connected to the first side 232c.

The FPCB 234 partially makes contact with the first lower frame portion 410. In the exemplary embodiment, for example, a portion of the FPCB 234, on which the driving chip 235 is mounted, makes contact with the first lower frame portion 410. Thus, the opposite surface corresponding to the portion of the FPCB 234, on which the driving chip 235 is mounted, directly makes contact with the first lower frame portion 410. The portion of the FPCB 234 on which the driving chip 235 is mounted directly makes contact with the first lower frame portion 410, so that heat generated from the driving chip 235 may be dissipated outside through the first lower frame portion 410 which has a relatively larger area and relatively higher thermal conductivity.

As described above, the driving board 232 is disposed adjacent to the first covering part 100, and the portion of the FPCB 234 on which the driving chip 235 is mounted directly makes contact with the first lower frame portion 410, so that the display apparatus 1000 may dissipate the heat more efficiently.

Alternatively, the driving board 232 may be overlapped with the upper frame 300 and attached on the upper frame 300.

As mentioned above, the display apparatus 1000 may stably fix and receive the display panel 200 using the first covering part 100, the upper frame 300 and the lower frame 400 without an additional backlight assembly including a conventional receiving container which receives a light source and the display panel 200. Thus, a transparent display of the display apparatus 1000 may be implemented with an improved structural stability. In addition, the display apparatus 1000 is assembled more simply, so that the display apparatus 1000 may be manufactured, disassembled and repaired more easily.

Furthermore, the driving part 230 is disposed at a side of the display panel 200, for example, the driving part 230 is disposed at a first side of the display apparatus 1000 in a line, so that a frame width of the display panel 200 may be reduced and the display panel 200 may have the transparent structure. In addition, the FPCB 234 connected to the driving board 232 makes contact with the lower frame 400, so that heat generated inside of the display apparatus 1000 may be efficiently dissipated.

Figure 5:
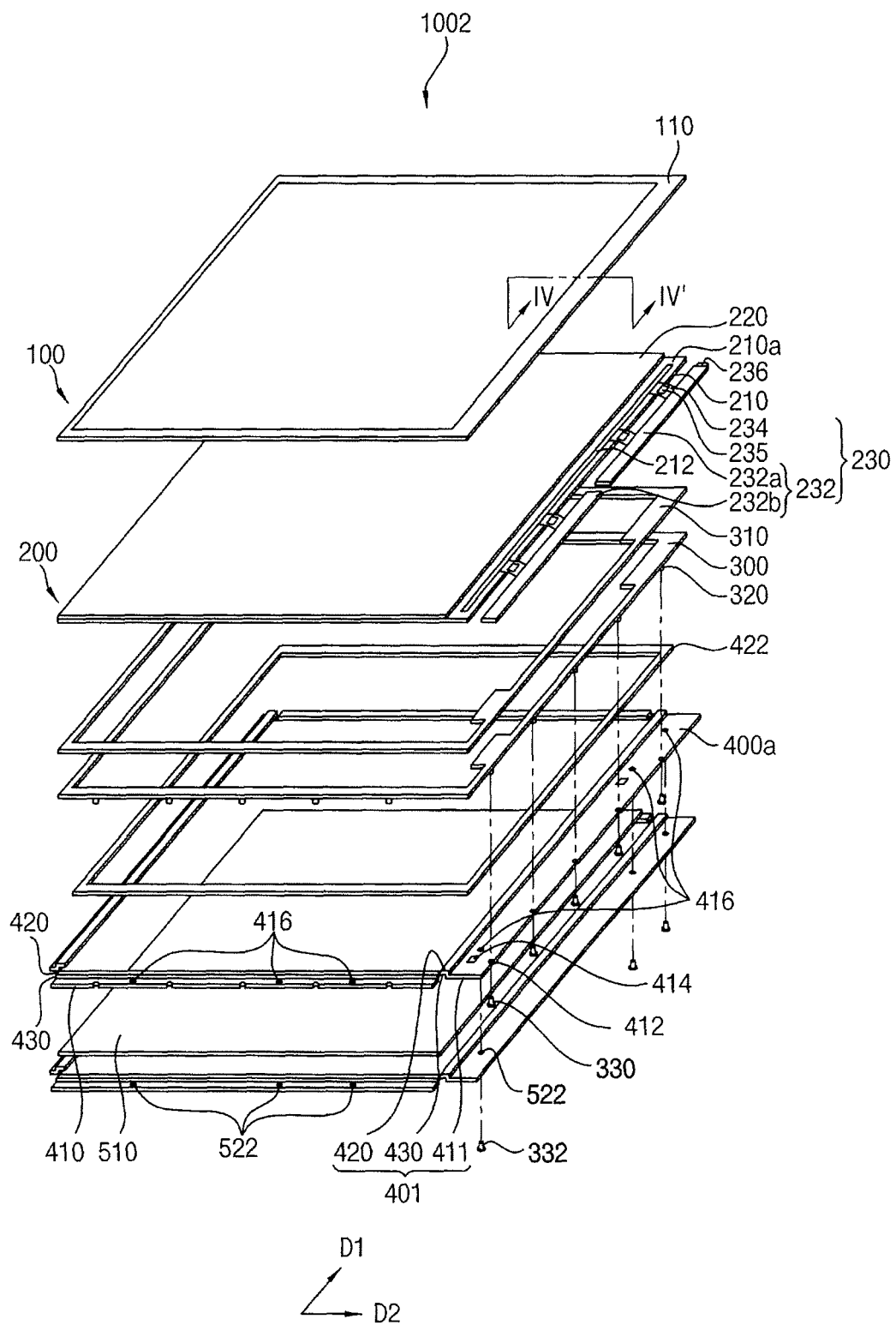
FIG. 5 is an exploded perspective view illustrating another exemplary embodiment of a display apparatus according to the invention.
Figure 6:
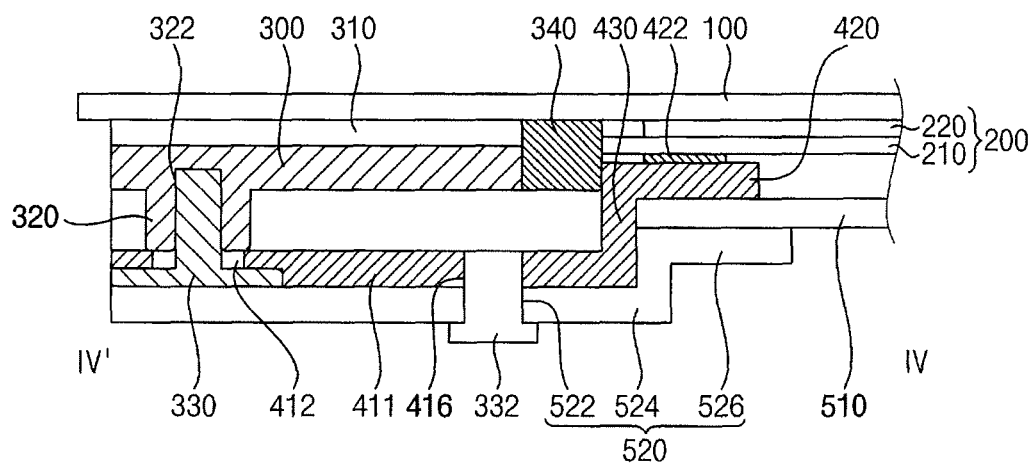
FIG. 6 is a cross-sectional view taken along line IV-IV' of FIG. 5.

FIG. 5 is an exploded perspective view illustrating another exemplary embodiment of a display apparatus according to the invention. FIG. 6 is a cross-sectional view taken along line IV-IV' of FIG. 5.

A display apparatus 1002 according to the exemplary embodiment in FIGS. 5 and 6 is substantially same as the display apparatus 1000 illustrated in FIGS. 1 to 3, except that structure of the lower frame 401 is different from that of the display apparatus 1000 and the display apparatus 1002 further includes a second covering part 510 and supporting frame 520 further under the display panel 200. Hereinafter, any repetitive explanation concerning the above elements will be omitted.

Referring to FIGS. 5 and 6, the display apparatus 1002 includes a first covering part 100, a display panel 200, an upper frame 300 including a first combining portion 320 including a first combining hole 322, the lower frame 401 including first and second lower frame portions 411 and 420 and a stepped portion 430, the second covering part 510 and the supporting frame 520.

The first lower frame portion 411 includes a second combining hole 412, a third combining hole 414 and a fourth combining hole 416. The first lower frame portion 411 is substantially same as the first lower frame portion 410 of the lower frame 400 illustrated in FIGS. 1 to 3, expect for the fourth combining hole 416. Thus, any repetitive explanation concerning the above elements will be omitted. The fourth combining hole 416 will be describe after explaining the second covering part 510 and the supporting frame 520.

The second covering part 510 is disposed under the second lower frame portion 420. The second covering part 510 may be a single, unitary, indivisible member. In one exemplary embodiment, for example, the second covering part 510 may include a same material as the first covering part 100. The second covering part 510 has a planar area smaller than a planar area of the first covering part 100, and is disposed closer to the second lower frame portion 420 than the first covering part 100. Thus, the second covering part 510 makes contact with the stepped portion 430 of the lower frame 401. Thus, the second covering part 510 may fill a blank space under the display panel 200 formed by the stepped portion 430 of the lower frame 401.

The supporting frame 520 supports the second covering part 510, and is combined with the first lower frame portion 411. For example, the supporting frame 520 may have a shape or profile similar to the lower frame 401. The supporting frame 520 includes a first supporting frame portion 524 under the lower frame 401, and a second supporting frame portion 526 extended from the first supporting frame portion 524 and under the second covering part 510. The second supporting frame portion 526 extends from a side of the first supporting frame portion 524 upwardly and is under the second covering part 510.

The fourth combining hole 416 includes a structure such that a sub-combining part 332 may be inserted and fixed. In one exemplary embodiment, for example, the fourth combining hole 416 may include a thread of a screw. The first supporting frame portion 524 may include a fifth combining hole 522 corresponding and aligned with the fourth combining hole 416 of the lower frame 401. The sub-combining part 332 is inserted into the fourth combining hole 416 through the fifth combining hole 522. Thus, the first lower frame portion 411 and the first supporting frame portion 524 are fixed to each other by the sub-combining part 332. In the exemplary embodiment, for example, the fourth and fifth combining holes 416 and 522 fix the first lower frame portion 411 and the first supporting frame portion 524, but not limited thereto. Alternatively, the fifth combining hole 522 may be at an area corresponding to the second combining hole 412. The combining part 330 may be inserted into the first combining hole 322 aligned with the fifth and second combining holes 522 and 412, so that the upper frame 300, the first lower frame portion 411 and the first supporting frame portion 524 are fixed with each other at the same time by a single fixing member combining part 330.

The second supporting frame 526 is under the second covering part 510, and substantially parallel with the second covering part 510. The second supporting frame 526 supports a peripheral portion of the second covering part 510. The first supporting frame portion 524 is fixed to the first lower frame portion 411 by the sub-combining part 332, and the second supporting frame portion 526 pushes the second covering part 510 upwardly to fix the second covering part 510 between the second lower frame portion 420 and the second supporting frame portion 526.

As mentioned above, the display apparatus 1002 further includes the second covering part 510 in addition to the elements of the display apparatus 1000 explained referring to FIGS. 1 to 3, so that the structural stability of the display apparatus 1002 may be improved. In addition, the second supporting frame portion 526 may stably support the peripheral portion of the second covering part 510, so that the display panel 200 may be stably fixed in the display apparatus 1002 with exposing a lower portion of the display panel 200 to outside.

In addition, the blank space formed under the display panel 200 may be used, so that thickness of the display apparatus 1002 may be reduced.

Figure 7:
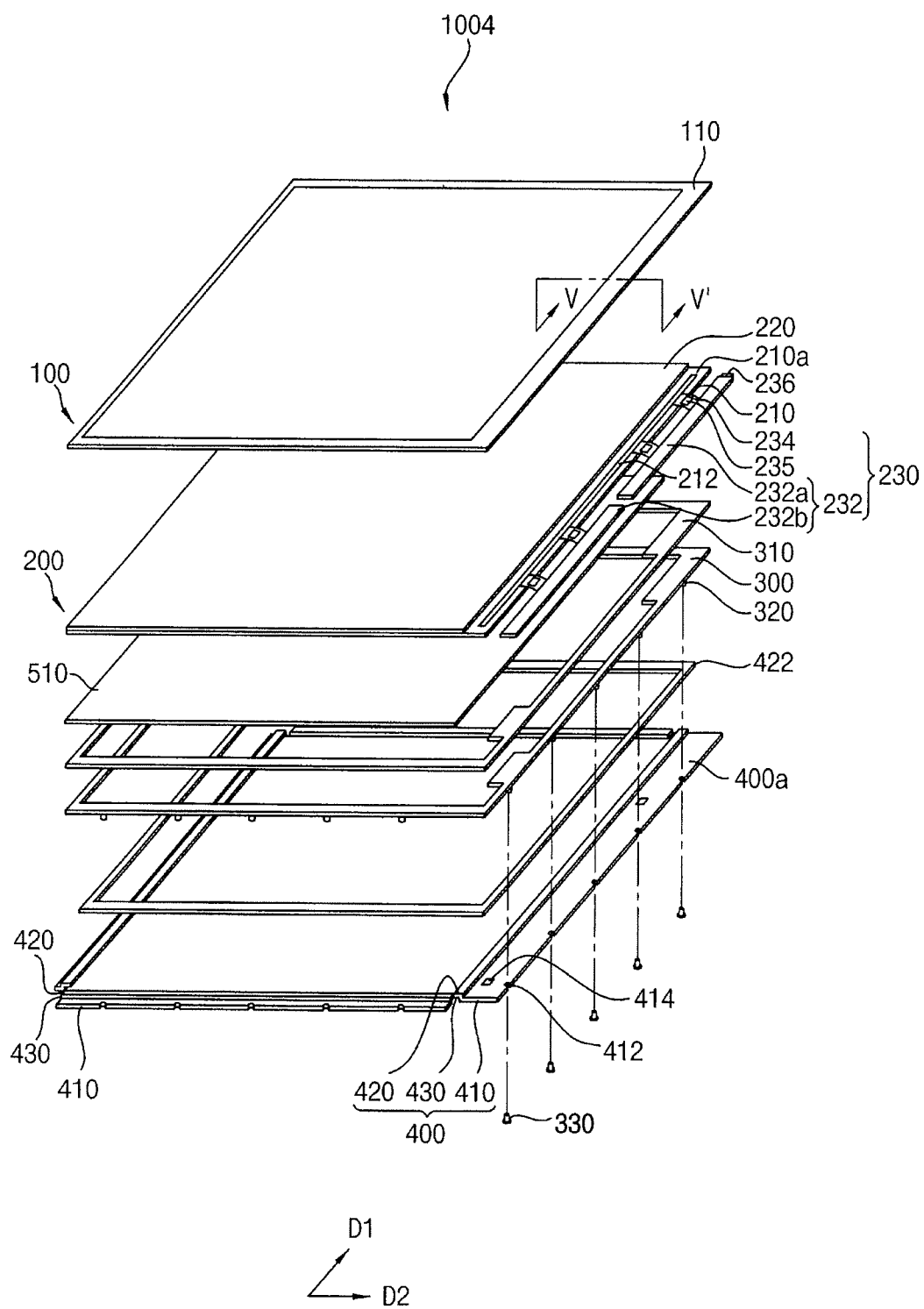
FIG. 7 is an exploded perspective view illustrating still another exemplary embodiment of a display apparatus according to the invention.
Figure 8:
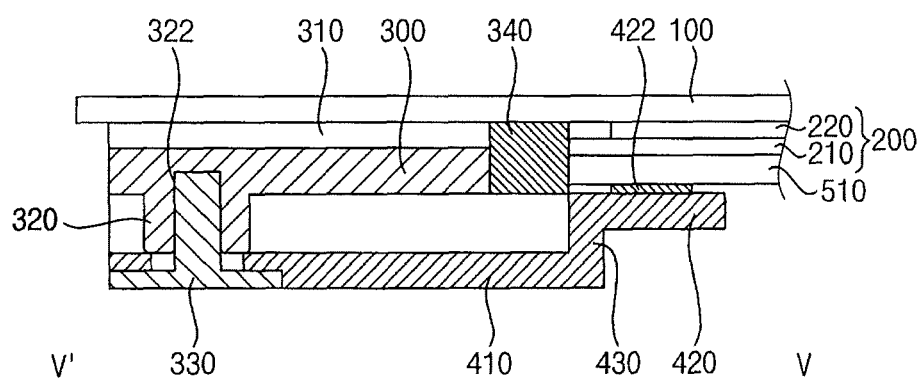
FIG. 8 is a cross-sectional view taken along line V-V' of FIG. 7.

FIG. 7 is an exploded perspective view illustrating still another exemplary embodiment of a display apparatus according to the invention. FIG. 8 is a cross-sectional view taken along line V-V' of FIG. 7.

A display apparatus 1004 according to the exemplary embodiment in FIGS. 7 and 8 is substantially same as the display apparatus 1000 illustrated in FIGS. 1 to 3, except that a second covering part 510 is further disposed under the display panel 200. Thus, any repetitive explanation concerning the above elements will be omitted.

Referring to the FIGS. 7 and 8, the display apparatus 1004 includes a first covering part 100, a display panel 200, an upper frame 300 including a first combining portion 320 including a first combining hole 322, a lower frame 400 including first and second lower frame portions 411 and 420 and a stepped portion 430, and a second covering part 510.

The second covering part 510 may include a same material as the first covering part 100. The second covering part 510 has a planar area smaller than a planar area of the first covering part 100, and is disposed close to the display panel 200 on the peripheral portion of the display panel 200 opposite to the first covering part 100.

The second lower frame portion 420 of the lower frame 400 is under the second covering part 510, and disposed substantially parallel with the second covering part 510. The second lower frame portion 420 supports the peripheral portion of the second covering part 510. The first lower frame portion 410 is fixed to the upper frame 300 by the combining part 330, and the second lower frame portion 420 pushes the second covering part 510 upwardly to fix the second covering part 510 between the display panel 200 and the lower frame 400. A height of the stepped portion 430 is larger than that of the first combining portion 320. When the first lower frame portion 410 is combined with the upper frame 300 by the combining part 330, the stepped portion 430 may have height such that the second lower frame portion 420 may stably support and fix the second covering part 510.

As mentioned above, the display apparatus 1004 further includes the second covering part 510 and the second covering part 510 faces the display panel 200, so that the structural stability of the display apparatus 1004 may be improved. The structural stability of the display apparatus 1004 according to the exemplary embodiment may be better than that of the display apparatus 1002 illustrated in FIGS. 5 and 6. The second lower frame portion 420 may stably support the peripheral portion of the second covering part 510, so that the structural stability of the display panel 200 may be improved even though a lower portion of the array substrate 210 is partially exposed to outside.

Figure 9:
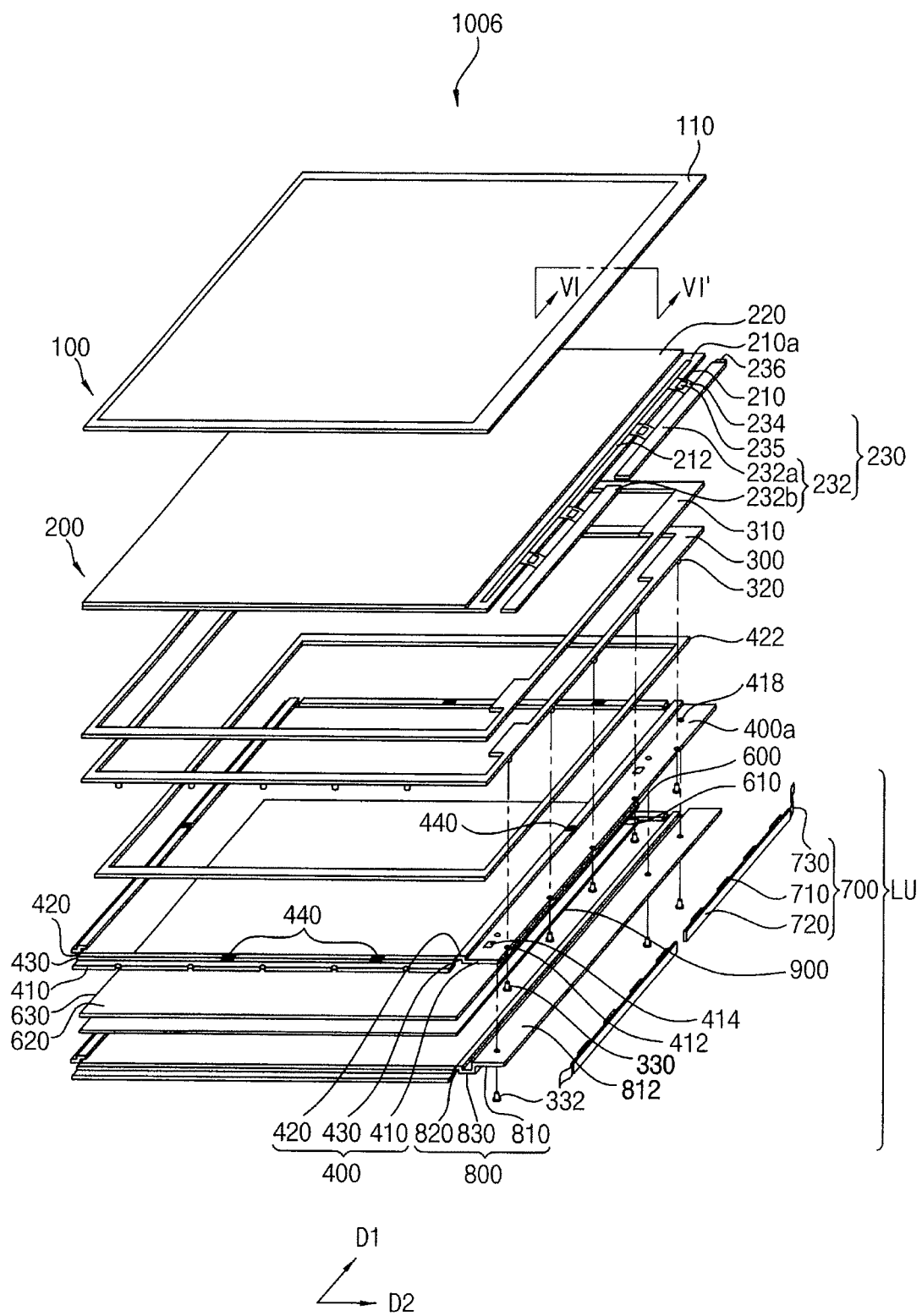
FIG. 9 is an exploded perspective view illustrating still another exemplary embodiment of a display apparatus according to the invention.
Figure 10:
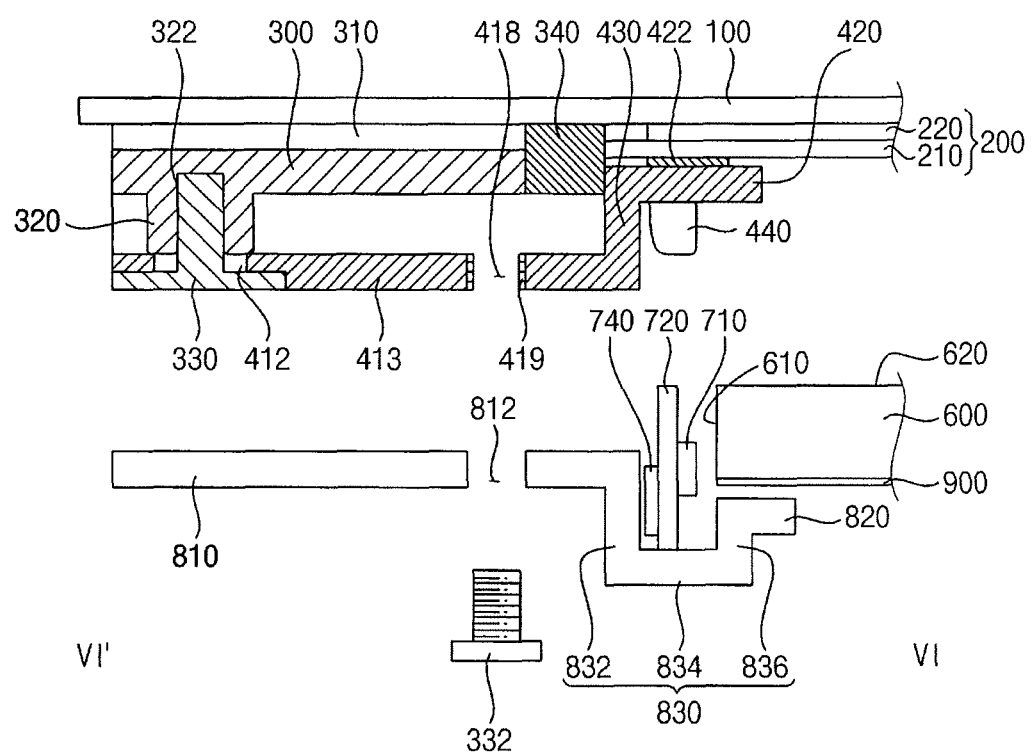
FIG. 10 is a cross-sectional view taken along line VI-VI' of FIG. 7.

FIG. 9 is an exploded perspective view illustrating still another exemplary embodiment of a display apparatus according to the invention. FIG. 10 is a cross-sectional view taken along line VI-VI' of FIG. 9.

A display apparatus 1006 according to the exemplary embodiment in FIGS. 9 and 10 is substantially same as the display apparatus 1000 illustrated in FIGS. 1 to 3, except that display apparatus 1006 further includes a backlight assembly LU disposed under the display panel 200. Thus, any repetitive explanation concerning the above elements will be omitted.

Referring to the FIGS. 9 and 10, the display apparatus 1006 includes a first covering part 100, a display panel 200, an upper frame 300 including a first combining portion 320 including a first combining hole 322, a lower frame 400 including first and second lower frame portions 411 and 420 and a stepped portion 430, and a backlight assembly LU. The backlight assembly LU includes a light guiding plate 600, a light source 700 and an outside supporting frame 800.

The light guiding plate 600 changes an incident light having optical distribution of a point light source or a line light source, to an exiting light having optical distribution of a surface light source. The light guiding plate 600 includes a first surface 610 to which the light source 700 is disposed adjacent, and a second surface 620 through which the light incident into the first surface 610 exits. The light guiding plate 600 may have a plate shape having uniform thickness. Alternatively, thickness of the light guiding plate 600 may be gradually decreased or increased as a distance from the light source 700 increases. The light guiding plate 600 may have relatively high transparency to increase transparency of the display apparatus 1006.

In the exemplary embodiment in FIG. 9, the light source 700 is disposed at a side of the light guiding plate 600, but not limited thereto. In one exemplary embodiment, for example, the light source 700 may include a first light source group disposed adjacent to the first surface 610, and a second light source group disposed adjacent to a third surface 630 opposite to the first surface 610.

The light source 700 includes a light emitting diode ("LED") 710 generating light using an external driving power supply and semiconductor properties. The LED 710 is a point light source emitting a point light having directivity. The LED 710 is mounted on the backlight assembly LU. The backlight assembly LU may include a circuit board 720 electrically connected to the external driving power supply through a light source driving film 730. The light source driving film 730 may extend from a side of the circuit board 720 and be connected to an external driving part (not shown). The light source 700 is disposed at a side of the light guiding plate 600. In the exemplary embodiment, for example, the light source is disposed adjacent to the first surface 610 of the light guiding plate 600.

The outside supporting frame 800 supports the light guiding plate 600 and the light source 700, and is combined with the lower frame 400. In the exemplary embodiment, for example, the outside supporting frame 800 includes a first supporting frame portion 810 under the first lower frame portion 410 and combined with the first lower frame portion 410, a second supporting frame portion 820 under the light guiding plate 600, and a third supporting frame portion 830 connecting the first supporting frame portion 810 to the second supporting frame portion 820 and receiving the light source 700.

The first lower frame portion 410 includes a second combining hole 412 and a sixth combining hole 418 to be combined with the first supporting frame portion 810. The sixth combining hole 418 includes a structure such that a sub-combining part 332 may be inserted and fixed therethrough. In the exemplary embodiment, for example, the sixth combining hole 418 may include a thread 419 of a screw. The first supporting frame portion 810 includes a seventh combining hole 812 corresponding to the sixth combining hole 418 in the lower frame 400. The sub-combining part 332 is inserted into the sixth combining hole 418 through the seventh combining hole 812. Thus, the first lower frame portion 410 and the first supporting frame portion 810 are combined with each other. In the exemplary embodiment, the first lower frame portion 410 and the first supporting frame portion 810 are fixed to each other by the sixth and seventh combining holes 418 and 812, not limited thereto. In an alternative exemplary embodiment, for example, the seventh combining hole 812 may correspond to the second combining hole 412 of the lower frame 400. In this case, the combining part 330 is inserted into the first combining hole 322 through the seventh and second combining holes 812 and 412, so that the upper frame 300, the first lower frame portion 410 and the first supporting frame portion 810 are fixed all together.

The second supporting frame portion 820 is disposed under the light guiding plate 600 and substantially parallel with the light guiding plate 600. The second supporting frame portion 820 supports peripheral portion of the light guiding plate 600. The first supporting frame portion 810 is fixed to the first lower frame portion 410 by the sub-combining part 332, and the second supporting frame portion 820 pushes the light guiding plate 600 upwardly to fix the light guiding plate 600.

The third supporting frame portion 830 connects the first supporting frame portion 810 to the second supporting frame portion 820, and receives the light source 700. In the exemplary embodiment, for example, the third supporting frame portion 830 includes a first sidewall portion 832 extending from the first outside frame portion 810 in a downward direction, a bottom portion 834 extending from the first sidewall portion 832 and substantially parallel with the light guiding plate 600, and a second sidewall portion 836 extending from the bottom portion 834 and connected with the second supporting frame portion 820. The third supporting frame portion 830 includes a receiving space formed by first and second sidewall portions 832 and 836 and the bottom portion 834. The light source 700 is received in the receiving space. The circuit board 720 may be attached to the first sidewall portion 832 using an adhesive 740.

The stepped portion 430 of the lower frame 400 connects the first lower frame portion 410 to the second lower frame portion 420. The light source 700 makes contact with the stepped portion 430. In the exemplary embodiment, for example, a lower portion of the light source 700 is received in the third supporting frame portion 830, and an upper portion of the light source 700 makes contact with the stepped portion 430, so that the light source 700 may be stably received and thickness of the display apparatus 1006 may be reduced.

The lower frame 400 may further include a guiding portion 440 guiding a side surface of the light guiding plate 600. The guiding portion 440 is protruded from the second lower frame portion 420 of the lower frame 400 in a downward direction, and supports the side surface of the light guiding plate 600. The guiding portion 440 may be inserted through an opening in the lower frame 400. The guiding portion 440 may extend from the lower frame 400.

The backlight assembly LU may further include a protection film 900 disposed under the light guiding plate 600. The protection film 900 is attached under the light guiding plate 600 to protect the light guiding plate 600. In one exemplary embodiment, for example, the protection film 900 may be a scratch protecting film.

As mentioned above, the display apparatus 1006 includes the backlight assembly LU including the light guiding plate 600 having relatively high transparency, so that the display apparatus 1006 may have relatively high transparency and provide the light without using an external light source. In addition, the outside frame 800 may stably receive the light source 700 and thickness of the display apparatus 1006 may be reduced.

According to the invention, the display apparatus includes a first covering part, an upper frame and a lower frame, so that a display panel may be stably fixed without additional backlight assembly having a receiving container. The first covering part is disposed on the display panel, the upper frame is attached under the first covering part, and the lower frame includes a first lower frame portion combined with the upper frame and a second lower frame portion supporting the display panel, so that the display apparatus may improve transparency and structural stability.

In addition, according to the invention, the display apparatus may be easily assembled and disassembled, so that manufacturing process and repairing process may be easy.

In addition, according to the invention, the driving part is disposed at a same first side of the display panel in a line, so that the display apparatus may have a transparent structure of the display panel and have a relatively thin frame width at the same time.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display apparatus comprising:
    a display panel comprising a display area, and a peripheral portion surrounding the display area;
    a lower frame which overlaps the peripheral portion of the display panel;
    an elastic part disposed between the display panel and the lower frame; and
    an upper frame surrounding the display panel in a plan view and comprising a first combining portion by which the upper frame is combined with the lower frame,
    wherein the upper frame is spaced apart from the display panel in the plan view.

2. The display apparatus of claim 1, wherein the first combining portion of the upper frame protrudes toward the lower frame.

3. The display apparatus of claim 1, further comprising a first covering part on the display panel,
    wherein
    the upper frame is disposed under the first covering part, and
    the display panel is disposed between the first covering part and the lower frame.

4. The display apparatus of claim 3, wherein the first covering part comprises a tempered glass.

5. The display apparatus of claim 4, further comprising an adhesive between the upper frame and the first covering part, such that the upper frame is attached to the first covering part by the adhesive.

6. The display apparatus of claim 1,
    wherein the upper frame faces the peripheral portion of the display panel, and
    further comprising a first elastic part between a side of the upper frame and a side of the display panel.

7. The display apparatus of claim 1, wherein in the plan view the lower frame comprises:
    a first lower frame portion which overlaps the upper frame; and
    a second lower frame portion which extends from the first lower frame portion and overlaps the display panel.

8. The display apparatus of claim 7, further comprising a combining part which combines the lower frame with the first combining portion of the upper frame.

9. The display apparatus of claim 8, wherein
    a first combining hole is defined in the first combining portion of the upper frame,
    a second combining hole is defined in the first lower frame portion and aligned with the first combining hole, and
    the combining part is combined with the first combining hole and extends through the second combining hole.

10. The display apparatus of claim 9, wherein
    the upper frame and the first lower frame portion are fixed to each other.

11. The display apparatus of claim 8, wherein the second lower frame portion overlaps the peripheral portion of the display panel in the plan view.

12. The display apparatus of claim 11, wherein the elastic part is disposed between the display panel and the second lower frame portion.

13. The display apparatus of claim 8, further comprising a backlight assembly comprising:
    a light guiding plate under the second lower frame portion;
    a light source adjacent to a side of the light guiding plate; and
    a supporting frame which overlaps a peripheral portion of the light guiding plate and the light source in the plan view, and is combined with the lower frame.

14. The display apparatus of claim 13, wherein the supporting frame comprises:
    a first supporting frame portion which overlaps the first lower frame portion in the plan view and is combined with the first lower frame portion;
    a second supporting frame portion which overlaps the light guiding plate in the plan view; and
    a third supporting frame which connects the first supporting frame portion to the second supporting frame portion, and receives the light source.

15. The display apparatus of claim 14, wherein the lower frame further comprises a stepped portion which connects the first lower frame portion to the second lower frame portion, and the light source is on the stepped portion.

* * * * *